(12) United States Patent
Masalkar et al.

(10) Patent No.: US 6,445,000 B1
(45) Date of Patent: Sep. 3, 2002

(54) PHOTODETECTING DEVICE

(75) Inventors: Prafulla Masalkar; Hiroji Ebe, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 54 days.

(21) Appl. No.: 09/590,262

(22) Filed: Jun. 9, 2000

(30) Foreign Application Priority Data

Jul. 30, 1999 (JP) .......................................... 11-217504

(51) Int. Cl.$^7$ .............................................. H01L 29/06
(52) U.S. Cl. ........................................ 257/21; 257/440
(58) Field of Search .......................... 257/21, 440, 441, 257/442; 250/338.4

(56) References Cited

U.S. PATENT DOCUMENTS

| 4,894,526 A | | 1/1990 | Bethea et al. | |
|---|---|---|---|---|
| 5,023,685 A | | 6/1991 | Bethea et al. | |
| 5,479,032 A | * | 12/1995 | Forrest et al. | 257/190 |
| 5,506,419 A | | 4/1996 | Levine et al. | |
| 5,646,421 A | * | 7/1997 | Liu | 257/21 |
| 6,130,466 A | * | 10/2000 | Schneider et al. | 257/440 |
| 6,184,538 B1 | * | 2/2001 | Bandara et al. | 257/21 |
| 6,239,449 B1 | * | 5/2001 | Fafard et al. | 257/17 |
| 6,271,943 B1 | * | 8/2001 | Goossen | 359/124 |
| 6,281,519 B1 | * | 8/2001 | Sugiyama et al. | 257/14 |

FOREIGN PATENT DOCUMENTS

| JP | 2-43777 A | 2/1990 |
|---|---|---|
| JP | 02241064 A | 9/1990 |
| JP | 63-246626 | 10/1998 |

* cited by examiner

*Primary Examiner*—Sara Crane
(74) *Attorney, Agent, or Firm*—Armstrong, Westerman & Hattori, LLP

(57) ABSTRACT

A first multi-quantum well structure 12 is formed on a GaAs substrate 10. The first multi-quantum well structure 12 is formed of an AlGaAs barrier layer and a GaAs well layer alternately laid one on the other to form a multi-quantum well. The GaAs barrier layer is not doped with an impurity. A second multi-quantum well structure 14 is formed on the first multi-quantum well structure 12. The second multi-quantum well structure 14 is formed of an AlGaAs barrier layer and a GaAs well layer alternately laid one on the other to form a multi-quantum well. The GaAs barrier layer is not doped with an impurity. Whereby a required electrode area can be smaller to thereby obtain higher detection sensitivity.

5 Claims, 8 Drawing Sheets

INFRARED RADIATION $\lambda_2 = 10\,\mu m$

PUMP RADIATION $0.839\,\mu m$

INFRARED RADIATION $\lambda_1 = 5\,\mu m$

PUMP RADIATION $0.756\,\mu m$

PUMP RADIATION

PHOTO CURRENT

1st PUMP RADIATION

2nd PUMP RADIATION

PHOTO CURRENT excellent# PHOTODETECTING DEVICE

BACKGROUND OF THE INVENTION

1. Field of the Invention

The present invention relates to a photodetecting device for detecting radiation of a plurality of wavelengths, more specifically, to a multi-color infrared focal plane array (IRFPA) using an absorption of infrared radiation by a quantum level of a quantum well structure or a quantum dot structure.

2. Description of the Related Art

For infrared imaging in an 8–12 $\mu$m wavelength range, quantum-well infrared photodetectors (QWIPs) using quantum well structures of compound semiconductors are used. The QWIPs have multi-quantum well (MQW) structure, which has quantum well structures stacked repeatedly by a plurality of times, and are infrared radiation detectors using electric conductivity changes due to contribution of electrons in the quantum wells excited by application of infrared radiation. As one of such infrared radiation detectors is known the infrared radiation detector described in the specification of Japanese Patent Laid-Open Publication No. 241064/1990, which has not a plurality of detecting elements but a single detecting element.

Recently a multi-color infrared radiation detector of multi-quantum well structures having different quantum levels for detecting infrared radiation of a plurality of wavelengths is proposed. One picture element of such infrared radiation detector will be explained with reference to FIG. 11.

A first multi-quantum well structure 102 and a second quantum well structure 104 are laid the one on the other on a semiconductor substrate 100. The first multi-quantum well structure 102 and the second multi-quantum well structure 104 are different from each other in the thickness of the quantum well layer and the composition ratio thereof, whereby both structures have quantum levels different from each other. Accordingly, a wavelength of infrared radiation absorbed by the first multi-quantum well structure 102 is different from that absorbed by the second multi-quantum well structure 104.

A first electrode 110 is formed on the underside of the first multi-quantum well structure 102. A second electrode 112 is formed on the upper side of the first multi-quantum well structure 102. A third electrode 114 is formed on the upper side of the second quantum well structure 104. An electric conductivity between the first electrode 110 and the second electrode 112, and an electric conductivity between the second electrode 112 and the third electrode 114 are measured to thereby separately detect infrared radiation of different wavelengths.

When a plurality of such picture elements are arranged in a matrix to form an IRFPA, the structure shown in FIG. 11 requires the three electrodes 110, 112, 114 for each picture element. The electrodes 110, 112, 114 occupy an accordingly large area per one picture element, with a result of low detection sensitivity.

In the structure shown in FIG. 11, the second electrode 112 could be the common electrode for each picture element, but the structure makes it impossible. This is because the first electrode 110 and the third electrode 114 of one picture element must be separated from those of another picture element. Accordingly, the structure shown in FIG. 11 does not allow the electrode to be commonly used to increase the detection area for higher detection sensitivity.

SUMMARY OF THE INVENTION

An object of the present invention is to provide a photodetecting device having area required for electrode decreased for higher detection sensitivity.

The above-described object is achieved by a photodetecting device comprising: a first quantum well structure including a first quantum well layer doped with an impurity, and having a first quantum level absorbing a radiation of a first wavelength; and a second quantum well structure laid on the first quantum well structure, including a second quantum well layer non-doped with an impurity, and having a second quantum level absorbing a radiation of a second wavelength which is different from the first wavelength.

The above-described object is also achieved by a photodetecting device comprising: a first quantum well structure including a first quantum well layer non-doped with an impurity, and having a first quantum level absorbing a radiation of a first wavelength; and a second quantum well structure laid on the first quantum well structure, including a second quantum well layer non-doped with an impurity, and having a second quantum level absorbing a radiation of a second wavelength which is different from the first wavelength.

The above-described object is also achieved by a photodetecting device comprising: a first quantum dot structure including a first quantum dot doped with an impurity, and having a first quantum level absorbing a radiation of a first wavelength; and a second quantum dot structure laid on the first quantum dot structure, including a second quantum dot non-doped with an impurity, and having a second quantum level absorbing a radiation of a second wavelength which is different from the first wavelength.

The above-described object is also achieved by a photodetecting device comprising: a first quantum dot structure including a first quantum dot non-doped with an impurity, and having a first quantum level absorbing a radiation of a first wavelength; and a second quantum dot structure laid on the first quantum dot structure, including a second quantum dot non-doped with an impurity, and having a second quantum level absorbing a radiation of a second wavelength which is different from the first wavelength.

The above-described object is also achieved by a photodetecting apparatus comprising: the above-described photodetecting device; and a radiation source for radiating a pump radiation of the second wavelength to the second quantum well structure.

The above-described object is also achieved by a photodetecting apparatus comprising: the above-described photodetecting device; a first radiation source for radiating a first pump radiation of the first wavelength to the first quantum dot structure; and a second radiation source for radiating a second pump radiation of the second wavelength to the second quantum dot structure.

The above-described object is also achieved by a method of controlling the above-described photodetecting device, comprising the steps of: applying a pump radiation of a wavelength generating carriers in the second quantum level; and detecting radiation of the second wavelength in synchronization with the application of the pump radiation.

The above-described object is also achieved by a method of controlling the above-described photodetecting device, comprising the steps of: applying a first pump radiation of a wavelength generating carriers in the first quantum level; and a second pump radiation of a wavelength generating carriers: in the second quantum level; and detecting a radiation of the first wavelength in synchronization with the application of the first pump radiation, and detecting a radiation of the second wavelength in synchronization with the application of the second pump radiation.

As described above, according to the present invention, the first quantum well structure including the first quantum well layer doped with an impurity and having a first quantum level absorbing a first wavelength, and the second quantum well structure including the second quantum layer non-doped with an impurity and having a second quantum level absorbing a second wavelength, which are stacked one on the other, whereby a required electrode area can be smaller to thereby obtain higher detection sensitivity.

A DETAILED DESCRIPTION OF THE INVENTION

Figure 1:
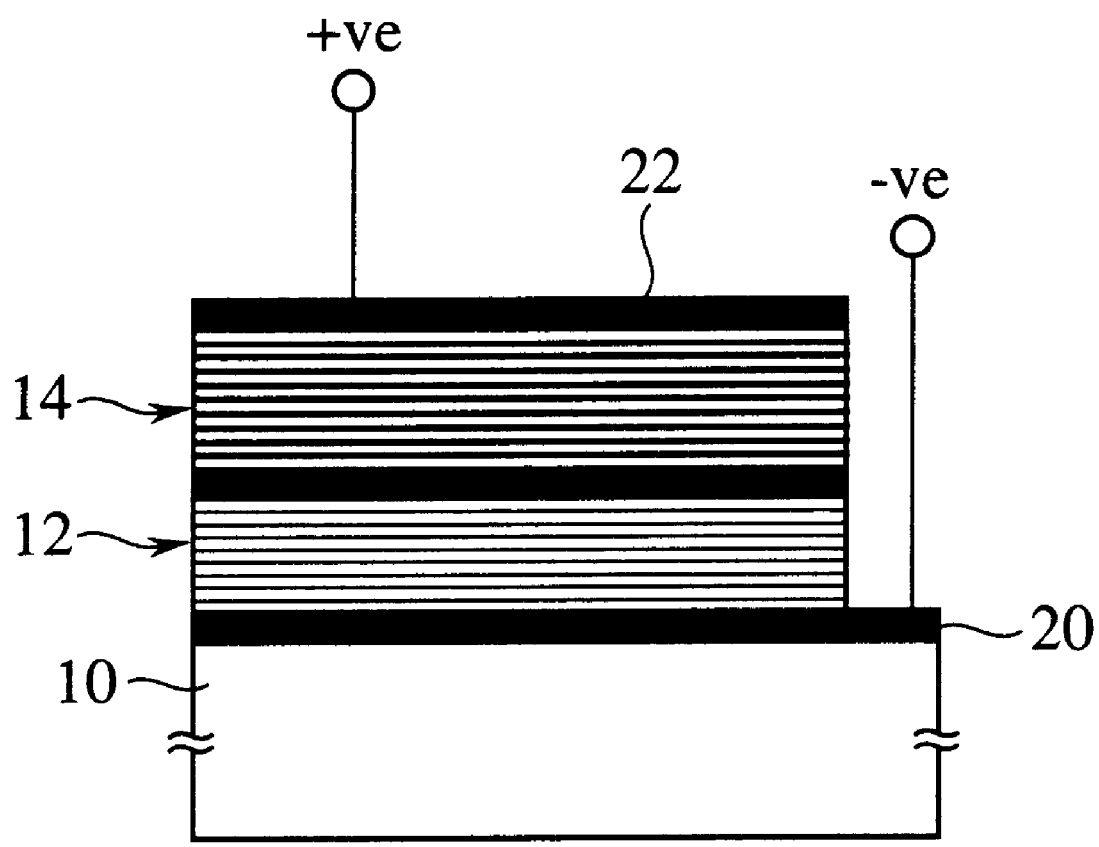
FIG. 1 is a sectional view of the infrared photodetector according to a first embodiment of the present invention, which shows a basic structure thereof.
Figure 2A:
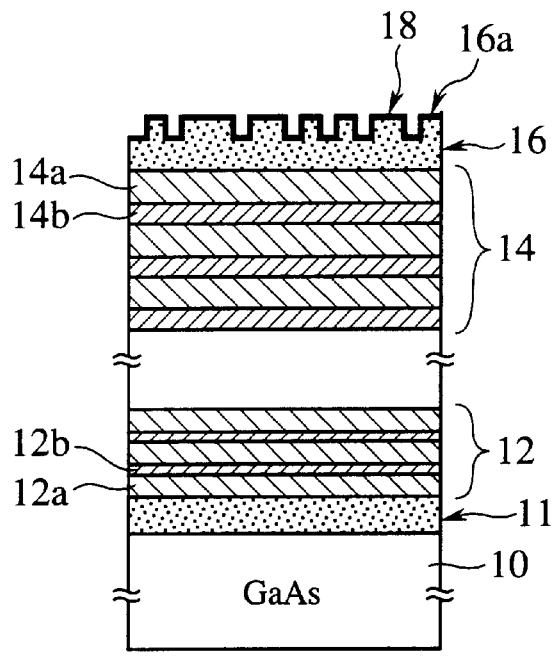
FIGS. 2A–2C are a sectional view and energy band structures of the infrared photodetector according to the first embodiment of the present invention, which details the device structure thereof.
Figure 2B:
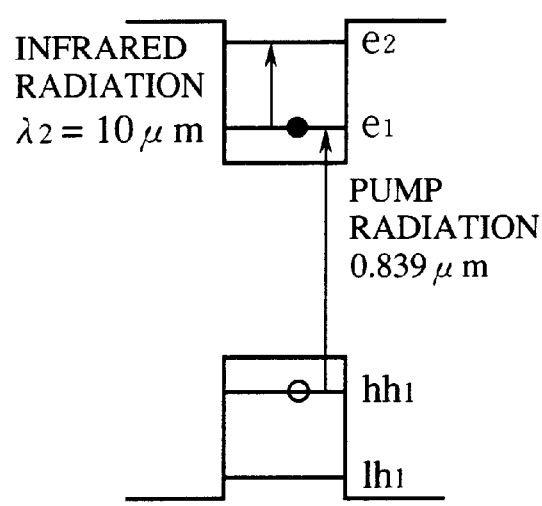
Figure 2C:
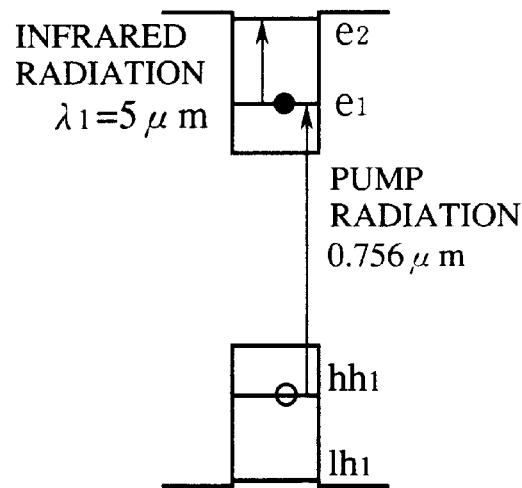
Figure 3:
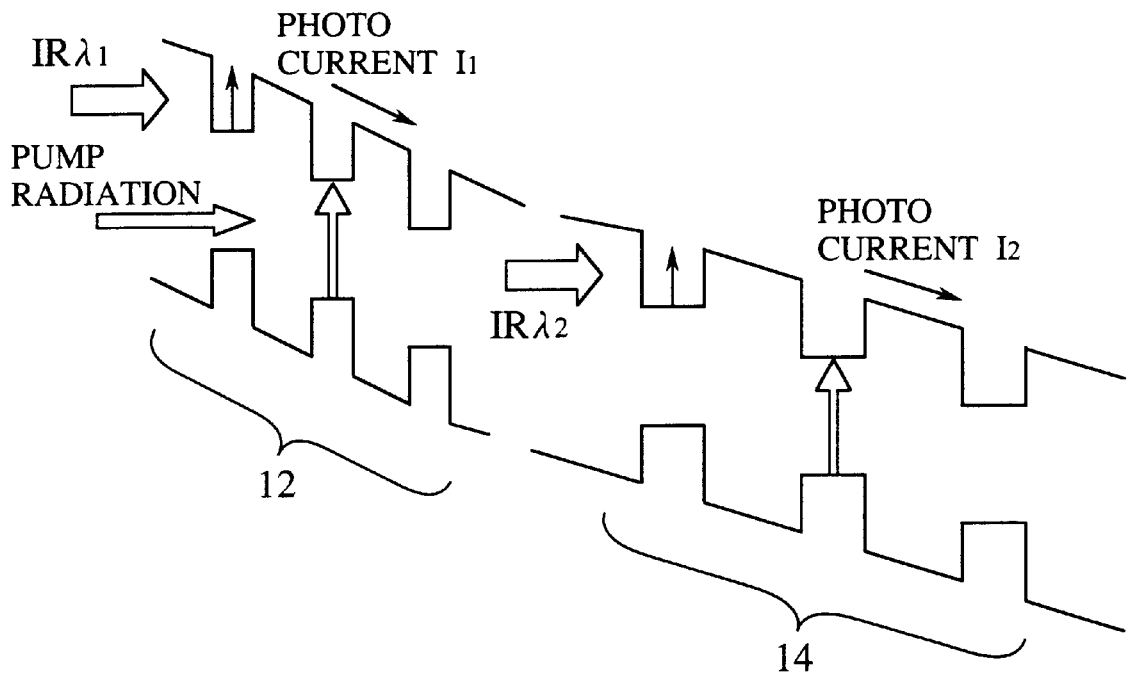
FIG. 3 is a view of an energy band structure of the infrared photodetector according to the first embodiment of the present invention.
Figure 4A:
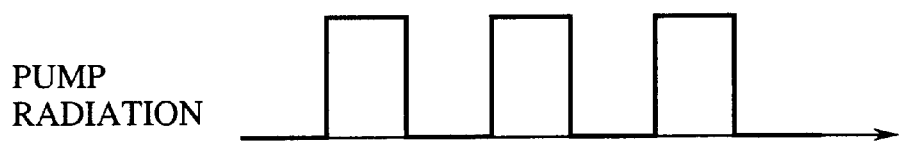
FIGS. 4A and 4B are views showing a method for controlling the infrared photodetector according to the first embodiment of the present invention.
Figure 4B:
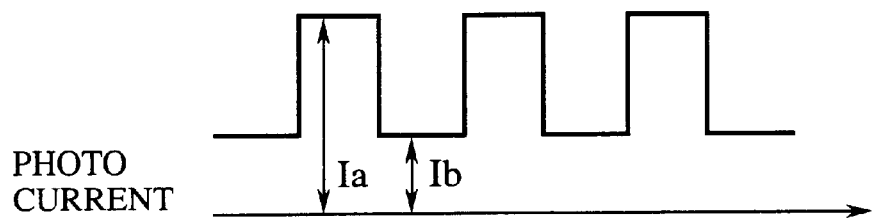
Figure 5:
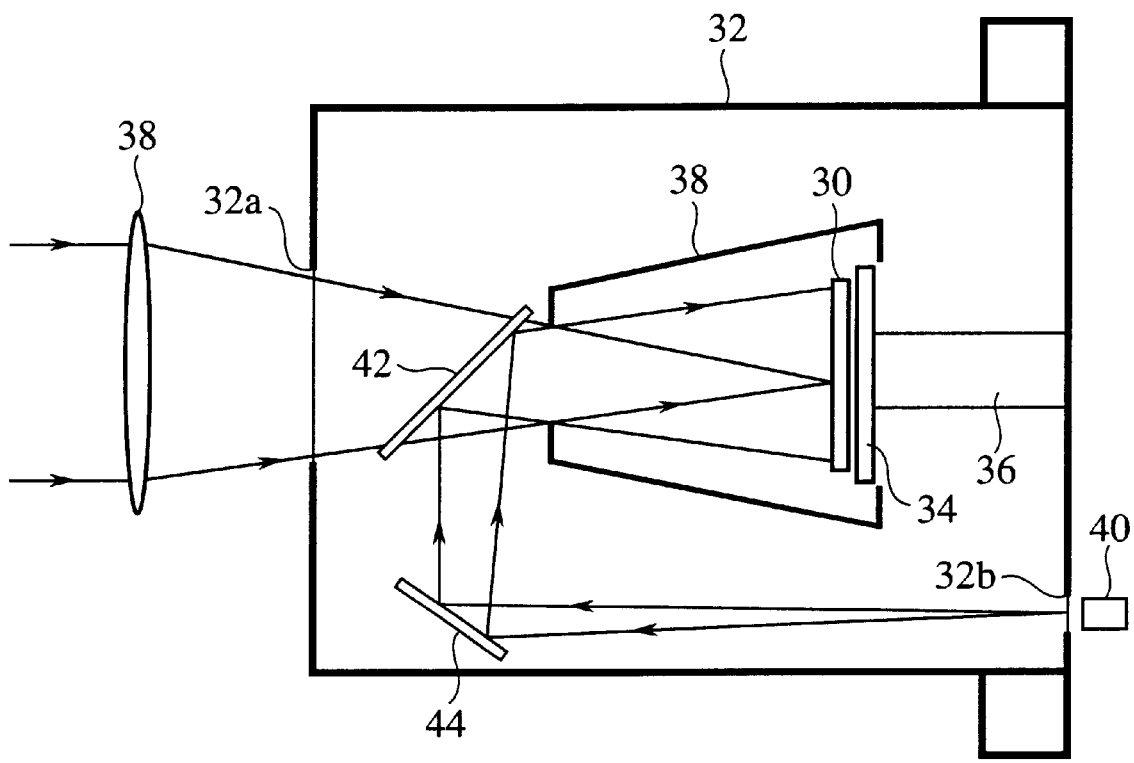
FIG. 5 is a view of a photodetecting apparatus using the infrared photodetector according to the first embodiment of the present invention.

An infrared photodetector according to a first embodiment of the present invention will be explained with reference to FIGS. 1, 2A–2C, 3, 4A–4B and 5. FIG. 1 is a sectional view of the infrared photodetector according to the present embodiment, which shows a basic structure thereof. FIGS. 2A–2C are a sectional view and energy band structures of the infrared photodetector according to the present embodiment, which details a device structure thereof. FIG. 3 is a view explaining an energy band structure of the infrared photodetector according to the present embodiment. FIGS. 4A and 4B are views explaining a method for controlling the infrared photodetector according to the present embodiment. FIG. 5 is a view of a photodetector using the infrared photodetector according to the present embodiment.

One picture element of the infrared photodetector according to the present embodiment has the basic structure shown in FIG. 1. A first multi-quantum well structure 12 is formed on a GaAs substrate 10. The first multi-quantum well structure 12 has a multi-quantum well having an AlGaAs barrier layer and a GaAs well layer laid alternately on each other. The GaAs barrier layer is not doped with an impurity.

A second multi-quantum well structure 14 is formed on the first multi-quantum well structure 12. The second multi-quantum well structure 14 has a multi-quantum well having AlGaAs barrier layer and a GaAs well layer laid alternately on each other. The GaAs barrier layer is doped with an impurity.

A first electrode 20 is formed in contact with the underside of the first multi-quantum well structure 12, and a second electrode 22 is formed in contact with the upperside of the second multi-quantum well structure 14. No electrode is formed between the first multi-quantum well structure 12 and the second multi-quantum well structure 14.

The device structure of the infrared photodetector according to the present embodiment is detailed in FIG. 2A. The first multi-quantum well structure 12 is formed on the GaAs substrate 10 intervening an about 200 nm-thick GaAs contact layer 11 therebetween.

The first multi-quantum well structure 12 is formed of an about 15 nm-thick $Al_{0.42}Ga_{0.58}$ As barrier layer 12a and an about 4 nm-thick GaAs well layer 12b laid alternately on each other several times. The GaAs well layer 12b is not doped with an impurity. The GaAs well layer 12b has an about $10^{12}$ cm$^{-3}$ impurity concentration.

The second multi-quantum well structure 14 is formed of an about 15 nm-thick $Al_{0.25}Ga_{0.75}$ As barrier layer 14a and an about 7.9 nm-thick GaAs well layer 14b laid alternately on each other several times. The GaAs well layer 14b is doped with an impurity of an about $10^{17}$ cm$^{-3}$–$10^{18}$ cm$^{-3}$ concentration.

A 200 nm-thick GaAs contact layer 16 is formed on the second multi-quantum well structure 14. A grating 16a for irregular reflection is formed in the upper surface of the GaAs contact layer 16. The grating 16a has the surface coated with a gold layer 18. Infrared radiation to be detected and pump radiation incident on the side of the GaAs substrate are irregularly reflected on the grating 16a and the gold layer 18 in various direction to pass through the first and the second multi-quantum well structures 12, 14, whereby efficiency of the infrared radiation and the pump radiation is increased.

Band structures of the first multi-quantum well structure 12 and the second multi-quantum well structure 14 are shown in FIGS. 2B and 2C, respectively. Quantum levels in the quantum wells are higher as Al composition ratios of the AlGaAs barrier layers 12a, 14a are higher. As the GaAs well layers 12b, 14b are thinner, quantum levels in the quantum wells are higher.

In the present embodiment, the first multi-quantum well structure 12 has a higher Al composition ratio of the AlGaAs barrier layer 12a and a smaller thickness of the GaAs well layer 12b. Accordingly, as shown in FIGS. 2B and 2C, the first multi-quantum well structure 12 has a higher quantum level in the quantum well.

As a result, in the first multi-quantum well structure, electrons are excited by infrared radiation of about 10.6 $\mu$m-wavelength between quantum levels in the quantum well, and pumped from a valence band to a ground state level of quantum well by pump radiation of about 0.839 $\mu$m-wavelength.

In the second multi-quantum well structure 14, electrons are excited by infrared radiation of about 5 µm-wavelength between quantum levels in the quantum well, and pumped by pump radiation of about 0.756 µm-wavelength from a valence band to a ground state level of the quantum well. In the present embodiment, the GaAs well layer 14b of the second multi-quantum well structure 14 is doped with an impurity, and it is not necessary to apply the pump radiation to supply electrons to the ground state level of the quantum well.

The operation principle of the infrared photodetector according to the present embodiment will be explained with reference to FIGS. 3 and 4A–4B.

A bias voltage is applied between the first electrode 20 and the second electrode 22 so that the first electrode 20 has a negative voltage. Thus, the energy band structure shown in FIG. 3 can be obtained.

The quantum well layer 12b of the first multi-quantum well structure 12 is not doped with an impurity, and electrons are pumped from a valence band to a ground state level of the quantum well only by thermal pumping. Unless pump radiation for exiting electrons from the valence band to the ground state level of the quantum well is incident, infrared radiation is not absorbed but is transmitted to be incident on the second multi-quantum well structure 14. When pump radiation is incident, prescribed infrared radiation is absorbed and can be detected.

On the other hand, the quantum well layer 14b of the second multi-quantum well structure 14 is doped with an impurity. In this case, even without pump radiation, electrons are supplied to a ground state level of the quantum well, and prescribed infrared radiation is absorbed and can be detected.

Thus, unless pump radiation is incident, infrared radiation can be detected only in the second multi-quantum well structure 14. When pump radiation is incident, however, infrared radiation can be detected both in the multi-quantum well structure 12 and in the second multi-quantum well structure 14. In the present embodiment, this characteristics is utilized so as to detect infrared radiation of two wavelengths.

Pulsed pump radiation as shown in FIG. 4A is applied, and photo current I as shown in FIG. 4B is detected. The pump radiation has wavelength of about 0.839 µm. When the pump radiation is applied, electrons are pumped from a valence band to a ground state level of the quantum well in the first multi-quantum well structure 12.

When photo current detected by the first multi-quantum well structure 12 is represented by $I_1$, and photo current detected by the second multi-quantum well structure 14 is represented by $I_2$, photo current $I_a$ detected when the pump radiation is not applied and photo current $I_b$ detected when the pump radiation is applied can be given by $I_a = I_1 + I_2$ $I_b = I_2$.

Thus, photo current $I_1$ detected by the first multi-quantum well structure 12 and photo current $I_2$ detected by the second multi-quantum well structure 14 can be given by $I_1 = I_a - I_b$ $I_2 = I_b$.

When video signals are generated by an infrared photodetector, a video signal has 30 frames per one second. A period of time of one frame is 33 msec (non-interlace system) or 17 msec (interlace system). Accordingly, an imaging time for the infrared photodetector can be about 10 msec. The pump radiation may be, e.g., 5 msec-pulsed radiation of 100 Hz at a 10 msec-period.

A photodetecting apparatus using the infrared photodetector according to the present embodiment will be explained with reference to FIG. 5. The infrared photodetector 30 is mounted on a table 34 disposed in a vacuum vessel 32. The table 34 is provided with a cooler 36. The infrared photodetector 30 is surrounded by a cold shield 38. Thus, the infrared photodetector 30 is kept cooled at about 70° K.

The vacuum vessel 32 has windows 32a, 32b. Radiation to be detected is incident through the window 32a, which is ahead of the infrared photodetector 30, and through the window 32b, which is behind the infrared photodetector 30 pump radiation is incident. The radiation to be detected is converged via a dichroic filter 42 on the infrared photodetector 30 by a lens 38. The pump radiation is emitted by a laser 40 and is converted on the infrared photodetector 30 by a mirror 44 and the dichroic filter 42.

The infrared radiation to be detected is detected while the infrared photodetector 30 is being cooled, and the 5 msec-pulsed pump radiation of 100 Hz, for example, is being emitted by the laser 40.

As described above, according to the present embodiment, only two electrodes are required for each picture element, and, in addition, one of the electrodes can be commonly used in terms of the structure. Accordingly, only one electrode may be provided for each picture element, whereby a relatively large detection area can be provided, resulting in higher detection sensitivity.

Figure 6:
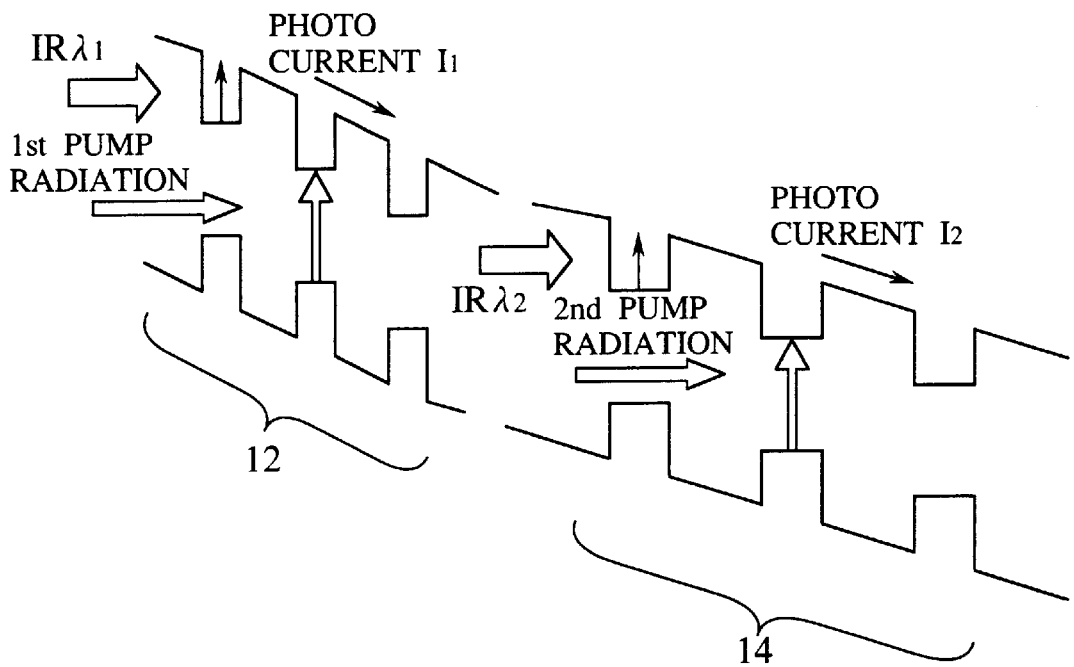
FIG. 6 is a view of an energy band structure of the infrared photodetector according to a second embodiment of the present invention.
Figure 7A:
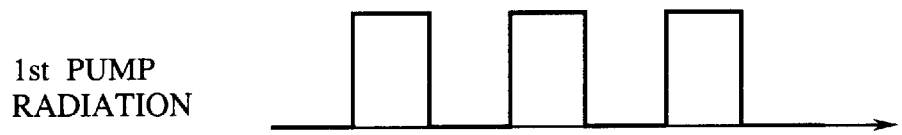
FIGS. 7A–7C are views showing a method for controlling the infrared photodetector according to the second embodiment of the present invention.
Figure 7B:
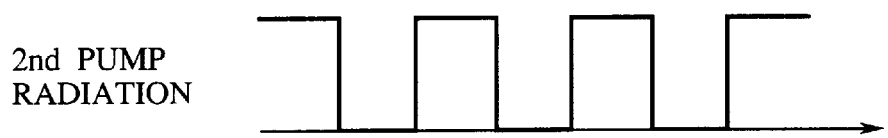
Figure 7C:
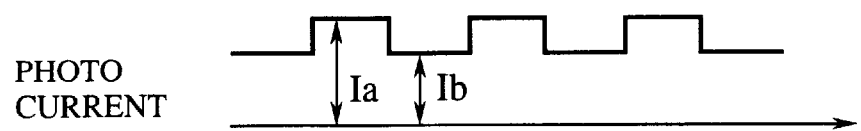
Figure 8:
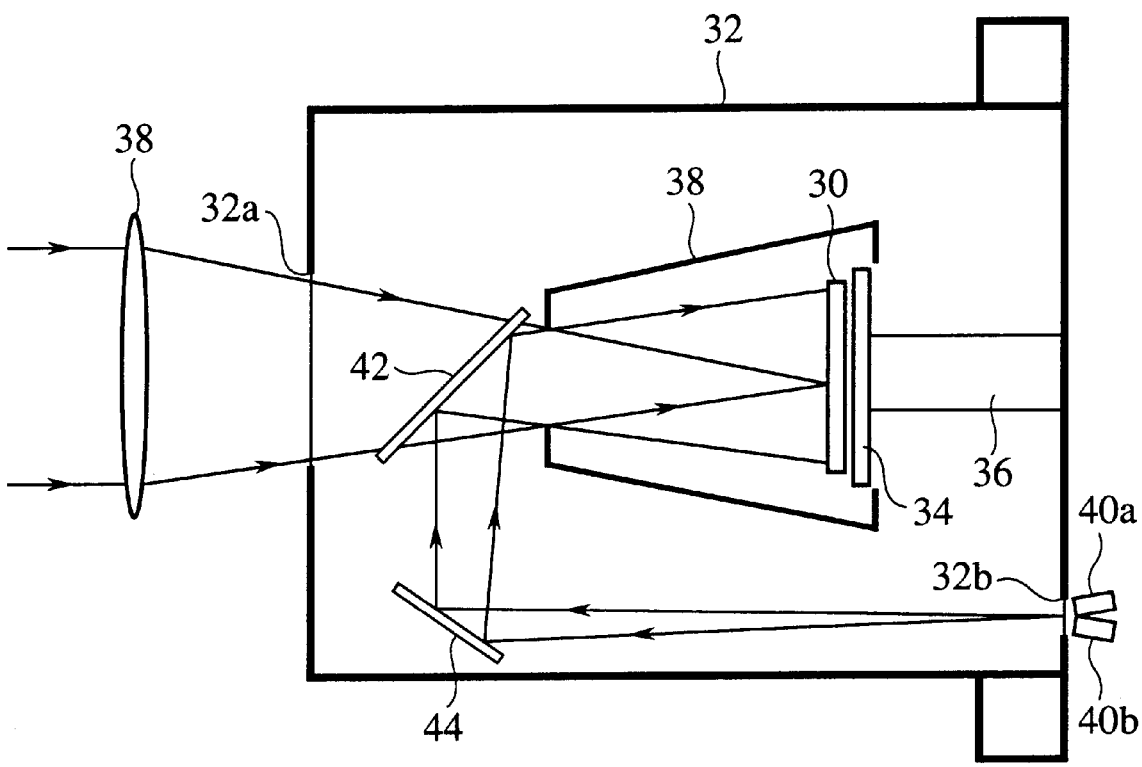
FIG. 8 is a view of a photodetecting apparatus using the infrared photodetector according to the second embodiment of the present invention.

The infrared photodetector according to a second embodiment of the present invention will be explained with reference to FIGS. 6, 7A–7C and 8. FIG. 6 is a view showing an energy band structure of the infrared photodetector according to the present embodiment. FIGS. 7A–7C are views showing a method of controlling the infrared photodetector method. FIG. 8 is a view of a photodetecting apparatus using the infrared photodetector according to the present embodiment. The same members and members of the same kinds as those of the first embodiment shown in FIGS. 1 to 5 are represented by the same reference numbers not to repeat or to simplify their explanation.

In the first embodiment, the GaAs well layer 14b of the second multi-quantum well structure 14 is doped with an impurity, but in the present embodiment a quantum well layer 14b of a second multi-quantum well structure 14 is not doped either with an impurity. An impurity concentration of the GaAs well layer 14b is about $10^{12}$ cm$^{-3}$. For the detection of infrared radiation by the second multi-quantum well structure 14, a pump radiation of an about 0.756 µm-wavelength is additionally required.

The operation principle of the infrared photodetector according to the present embodiment will be explained with reference to FIGS. 6 and 7A–7C.

A bias voltage is applied between a first electrode 20 and a second electrode 22 so that the first electrode 20 has a negative voltage, whereby the energy band structure shown in FIG. 6 can be obtained.

Neither the quantum well layer 12b of the first multi-quantum well structure 12 nor the quantum well layer 14b of the second multi-quantum well structure 14 are doped with impurities. Electrons are not pumped to a ground state level of the quantum wells by means other than thermal pumping. Unless pump radiation for pumping electrons from a valence band to a ground state level of the quantum well is incident, infrared radiation is not absorbed but is transmitted, by the first multi-quantum well structure 12 and the second multi-quantum well structure 14. When pump radiation is incident, prescribed infrared radiation is absorbed and can be detected.

Accordingly, first pump radiation (wavelength: about 0.839 μm) for pumping the quantum well layer 12b of the first multi-quantum well structure 12, and second pump radiation (wavelength: about 0.756 μm) for pumping the quantum well structure 14b of the second multi-quantum well structure 14 are alternately applied so as to detect infrared radiation of two wavelengths by the first multi-quantum well structure 12 and the second multi-quantum well structure 14.

First pump radiation and second pump radiation as shown in FIGS. 7A and 7B are alternately applied, and photo current I as shown in FIG. 7C is detected. When photo current detected by the first multi-quantum well structure 12 is represented by $I_1$, and photo current detected by the second multi-quantum well structure 14 is represented by $I_2$, photo current $I_a$ detected when the first pump radiation is applied, and photo current $I_b$ detected when the first pump radiation is not applied can be given by $$I_a = I_1$$

$$I_b = I_2.$$

When video signals are generated by an infrared photodetector, a video signal has 30 frames per one second. Periods of time of 33 msec (non-interlace system) or 17 msec (interlace system) is required to form an image of one frame. Accordingly, an imaging time for the infrared photodetector can be about 10 msec. The pump radiation may be, e.g., 5 msec-pulsed radiation of 100 Hz at a 10 msec-period.

A photodetecting apparatus using the infrared photodetector according to the present embodiment will be explained with reference to FIG. 8. A difference of the photodetecting apparatus using the infrared photodetector according to the present embodiment from that shown in FIG. 5 is that first laser 40a for emitting the first pumps radiation and a second laser 40b for emitting the second pump radiation are provided. The first laser 40a and the second laser 40b alternately emit the first pump radiation and the second pump radiation as shown in FIGS. 7A and 7B.

As described above, according to the present embodiment, only two electrodes are required for each picture element, and, in addition, one of the electrodes can be commonly used in terms of the structure. Accordingly, only one electrode may be provided for each picture element, whereby a relatively large detection area can be provided, with a result of higher detection sensitivity. Furthermore, unless the pump radiation is applied, infrared radiation is not detected, whereby infrared radiation can be detected with high sensitivity and less noises.

Figure 9:
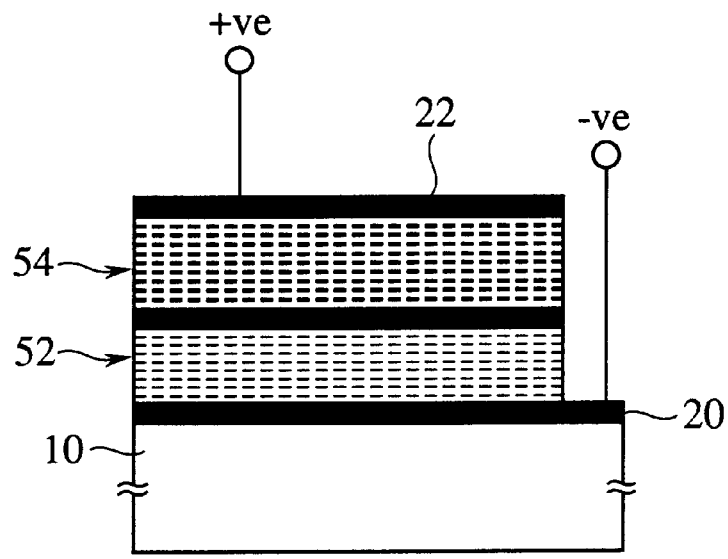
FIG. 9 is a sectional view of the infrared photodetector according to a third embodiment of the present invention, which shows a basic structure thereof.
Figure 10:
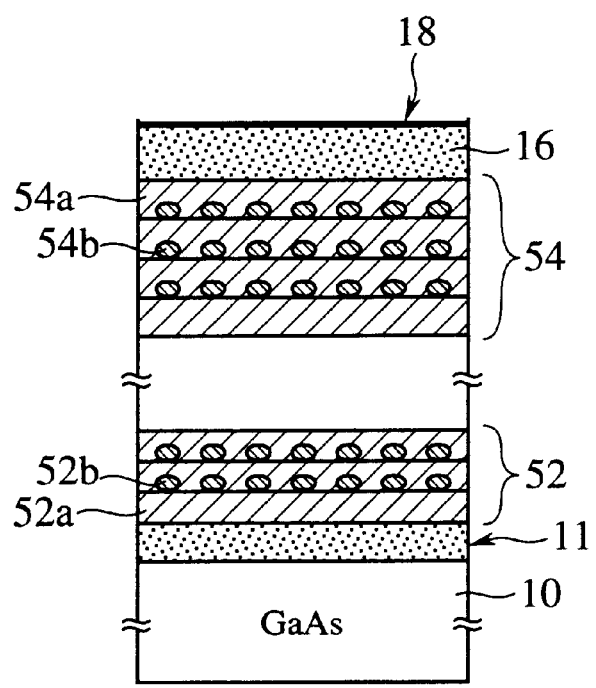
FIG. 10 is a sectional view of the infrared photodetector according to the third embodiment of the present invention, which details the device structure thereof.
Figure 11:
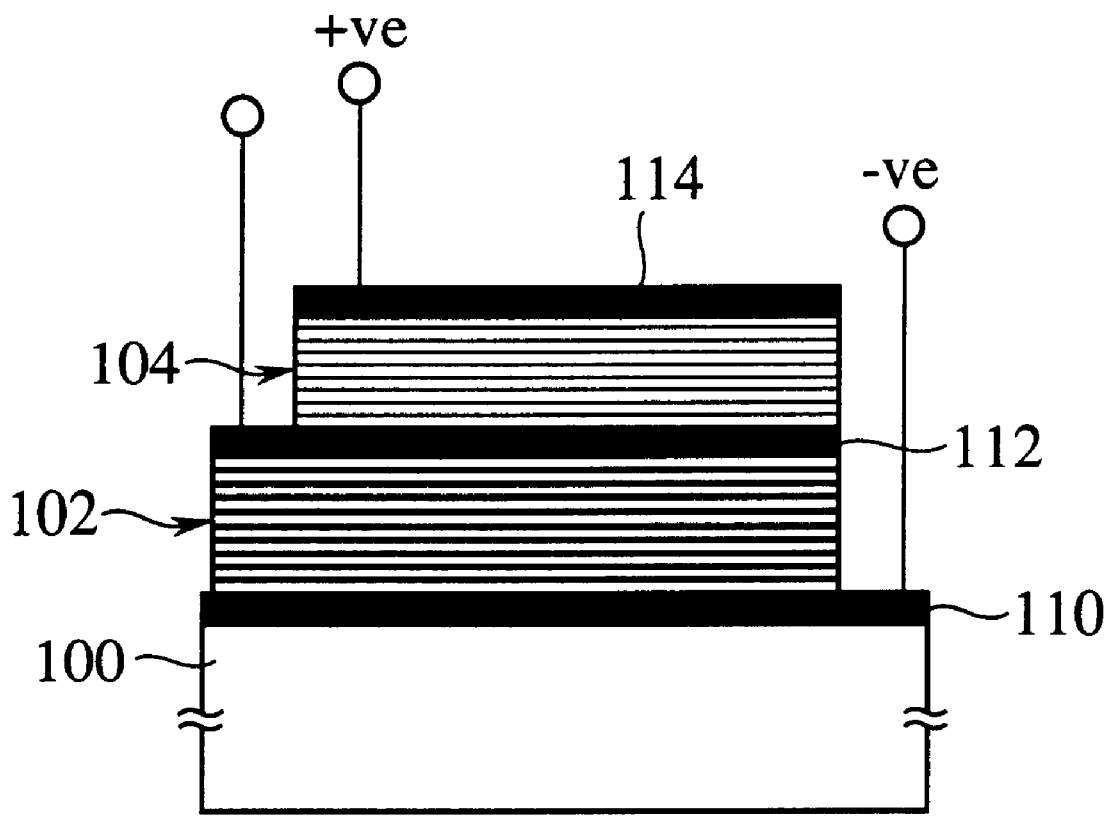
FIG. 11 is a sectional view of the conventional infrared photodetector, which shows the basic structure thereof.

The infrared photodetector according to a third embodiment of the present invention will be explained with reference to FIGS. 9 and 10. FIG. 9 is a sectional view of the infrared photodetector according to the present embodiment, which explains the basic structure thereof. FIG. 10 is a sectional view of the infrared photodetector according to the present embodiment, which details the device structure. The same members or member of the same kinds as those of the first embodiment shown in FIGS. 1 to 5 are represented by the same reference numbers not to repeat or to simplify their explanation.

One picture element of the infrared photodetector according to the present embodiment has the basic structure shown in FIG. 9. A first quantum dot structure 52 is formed on a GaAs substrate 10. The first quantum dot structure 52 has a quantum dot structure of an AlGaAs layer and a GaAs quantum dot layer alternately laid one on the other. The GaAs quantum dots are not doped with an impurity.

A second quantum dot structure 54 is formed on the first quantum dot structure 52. The second quantum dot structure 54 has a quantum dot structure of an AlGaAs layer and a GaAs quantum dot layer alternately laid one on the other. The GaAs quantum dots are doped with an impurity.

A first electrode 20 is formed on the underside of the first quantum dot structure 52 in contact therewith. A second electrode 22 is formed on the upperside of the second quantum dot structure 54 in contact therewith. No electrode is formed between the first quantum dot structure 52 and the second quantum dot structure 54.

The device structure of the infrared photodetector according to the present embodiment is detailed in FIG. 10. The first quantum dot structure 52 is formed on the GaAs substrate 10 intervening an about 200 nm-thick GaAs contact layer 11 therebetween.

The first quantum dot structure 52 is formed of a number of about 20 nm-thick $Al_{0.42}Ga_{0.58}As$ layers 52a and of about 4 nm-diameter GaAs quantum dots 52b alternately laid one on the other. The GaAs quantum dots 52b are not doped with an impurity. An impurity concentration of the GaAs quantum dots 52b is about $10^{12}$ cm$^{-3}$.

The second quantum dot structure 54 is formed of a number of about 20 nm-thick $Al_{0.25}Ga_{0.75}As$ layer 54a and an about 7 nm-diameter GaAs quantum dots 54b alternately laid one on the other. The GaAs quantum dots 54b are doped with an about $10^{17}$ cm$^{-3}$–$10^{18}$ cm$^{-3}$ concentration of an impurity.

An about 200 nm-thick GaAs contact layer 16 is formed on the second quantum dot structure 54. The upper surface of the GaAs contact layer 16 is coated with a gold layer 18. Infrared radiation to be detected and pump radiation incident on the side of the GaAs substrate 10 are reflected on the gold layer 18 to pass through the first and the second quantum dot structures 52, 54, whereby efficiency of the infrared radiation and the pump radiation is increased.

In the present embodiment, the first quantum dot structure 52 has a higher Al composition ratio of the AlGaAs layer 52a and a smaller diameter of the GaAs quantum dots 52b and accordingly has a higher quantum level in the quantum dots.

As a result, in the first quantum dot structure 52, electrons are excited between quantum level of the quantum dots by about 5 μm-wavelength infrared radiation, and by about 0.75 μm-wavelength pump radiation electrons are pumped from a valence band to a ground state level of the quantum dot.

In the second quantum dot structure 52, electrons are excited between quantum levels of the quantum dots by about 10 μm-wavelength infrared radiation, and by about 0.85 μm-wavelength pump radiation electrons are pumped from a valence band to a ground state level of the quantum dot. In the present embodiment, wherein the GaAs quantum dots 54b of the second quantum dot structure 54 are doped with an impurity, it is not necessary to apply pump radiation to pump electrons to a ground state level of the quantum dots.

As described above, according to the present embodiment, one picture element requires only two electrodes, and, in addition, one of the electrodes can be commonly used easily in terms of the structure. Accordingly, one electrode may be provided for one picture element, whereby a relatively large detection area can be available accordingly for higher detection sensitivity. Furthermore, quantum levels of the quantum dots are utilized, whereby the infrared photodetector can have high sensitivity of separating a detected wavelength.

The present invention is not limited to the above-described embodiments and can cover other various modifications. For example, in the above-described embodiments, two quantum well structures or two quantum dot structures are stacked one on the other. However, three or more quantum well structures or quantum dot structures may be stacked one on another so as to enable detection of infrared radiation of more wavelengths.

In the above-described embodiments, infrared photodetector for detecting infrared radiation are exemplified, but not only infrared radiation but also other radiation, such as visible light, etc., may be detected.

The semiconductor materials, film thicknesses, impurity concentrations, etc., used in the above-described embodiments are only examples, and the present invention is not limited to them.

What is claimed is:

1. A photodetecting device comprising:
   a first quantum dot structure including a first quantum dot doped with an impurity, and having a first quantum level absorbing a radiation of a first wavelength; and
   a second quantum dot structure laid on the first quantum dot structure, including a second quantum dot non-doped with an impurity, and having a second quantum level absorbing a radiation of a second wavelength which is different from the first wavelength.

2. A photodetecting apparatus comprising:
   a photodetecting device comprising:
     a first quantum well structure including a first quantum well layer doped with an impurity, and having a first quantum level absorbing a radiation of a first wavelength; and
     a second quantum well structure laid on the first quantum well structure, including a second quantum well layer non-doped with an impurity, and having a second quantum level absorbing a radiation of a second wavelength which is different from the first wavelength; and
     a radiation source for radiating a pump radiation for generating a carrier in the second quantum-well layer in order to absorb the radiation of the second wavelength by the second quantum level.

3. A photodetecting apparatus comprising:
   a photodetecting device comprising:
     a first quantum well structure including a first quantum well layer non-doped with an impurity, and having a first quantum level absorbing a radiation of a first wavelength; and
     a second quantum well structure laid on the first quantum well structure, including a second quantum well layer non-doped with an impurity, and having a second quantum level absorbing a radiation of a second wavelength which is different from the first wavelength;
     a first radiation source for radiating a first pump radiation for generating a carrier in the first quantum well layer in order to absorb the radiation of the first wavelength by the first quantum level; and
     a second radiation source for radiating a second pump radiation for generating a carrier in the second quantum well layer in order to absorb the radiation of the second wavelength by the second quantum level.

4. A photodetecting apparatus comprising:
   the photodetecting device according to claim 1; and
   a radiation source for radiating a pump radiation for generating a carrier in the second quantum dot in order to absorb the radiation of the second wavelength by the second quantum level.

5. A photodetecting apparatus comprising:
   a photodetecting device comprising:
     a first quantum dot structure including a first quantum dot non-doped with an impurity, and having a first quantum level absorbing a radiation of a first wavelength; and
     a second quantum dot structure laid on the first quantum dot structure, including a second quantum dot non-doped with an impurity, and having a second quantum level absorbing a radiation of a second wavelength which is different from the first wavelength;
     a first radiation source for radiating a first pump radiation for generating a carrier in the first quantum dot in order to absorb the radiation of the first wavelength by the first quantum level; and
     a second radiation source for radiating a second pump radiation for generating a carrier in the second quantum dot in order to absorb the radiation of the second wavelength by the second quantum level.

* * * * *